(12) United States Patent
Cao et al.

(10) Patent No.: US 9,245,476 B2
(45) Date of Patent: Jan. 26, 2016

(54) START CONTROL CIRCUIT, DISPLAY PANEL DRIVING CIRCUIT AND DISPLAY DEVICE

(71) Applicant: Shenzhen China Star Optoelectronics Technology Co., Ltd., Shenzhen, Guangdong (CN)

(72) Inventors: Dan Cao, Guangdong (CN); Jiehui Qin, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 260 days.

(21) Appl. No.: 14/001,874

(22) PCT Filed: Jun. 25, 2013

(86) PCT No.: PCT/CN2013/077873
§ 371 (c)(1),
(2) Date: Aug. 28, 2013

(87) PCT Pub. No.: WO2014/172985
PCT Pub. Date: Oct. 30, 2014

(65) Prior Publication Data
US 2014/0320483 A1 Oct. 30, 2014

(30) Foreign Application Priority Data

Apr. 24, 2013 (CN) ...................... 2013 2 0210838 U

(51) Int. Cl.
*G09G 3/32* (2006.01)
*H03K 17/16* (2006.01)

(52) U.S. Cl.
CPC ................. *G09G 3/32* (2013.01); *H03K 17/166* (2013.01); *G09G 2310/0272* (2013.01); *G09G 2330/025* (2013.01); *Y10T 307/747* (2015.04)

(58) Field of Classification Search
CPC ............... H05B 37/02; H05B 33/0833; H05B 33/0884; G09G 3/36; G09G 3/3406; G09G 5/10
USPC ............. 345/204–215, 87–102; 315/291, 312
See application file for complete search history.

(56) References Cited

U.S. PATENT DOCUMENTS

| | | | |
|---|---|---|---|
| 5,796,215 A * | 8/1998 | Parry et al. ..................... 315/224 |
| 2001/0017779 A1* | 8/2001 | Nagahara ........................ 363/16 |
| 2004/0032754 A1* | 2/2004 | Yang ......................... 363/56.09 |
| 2007/0126367 A1* | 6/2007 | Zhou et al. ................ 315/209 R |
| 2009/0184671 A1* | 7/2009 | Kimura ......................... 315/308 |
| 2009/0278521 A1* | 11/2009 | Omi et al. ...................... 323/288 |
| 2010/0301762 A1* | 12/2010 | Kung et al. .................... 315/193 |
| 2010/0302289 A1* | 12/2010 | Park et al. ..................... 345/691 |

(Continued)

Primary Examiner — Hong Zhou

(57) ABSTRACT

A start control circuit is provided, which comprises a first switch unit, a start control unit and a second switch unit; the first switch unit is configured to determine a charging path of the start control unit according to the input signals of different start modes; the start control unit is configured to carry out the corresponding start modes, and start energy of the corresponding start modes is stored during a period of charging time corresponding to the charging path, thereby control the current of the second switch unit at the starting moment; and the second switch unit is configured to control an external circuit by receiving gating signals outputted from the start control unit. The present invention also provides a display panel driving circuit and a display device using the start control circuit.

15 Claims, 1 Drawing Sheet

(56) References Cited

U.S. PATENT DOCUMENTS

| | | | |
|---|---|---|---|
| 2011/0175587 A1* | 7/2011 | Hosotani | 323/283 |
| 2011/0279045 A1* | 11/2011 | Uchimoto et al. | 315/186 |
| 2012/0235657 A1* | 9/2012 | Ito et al. | 323/282 |
| 2012/0320023 A1* | 12/2012 | Tsai et al. | 345/212 |
| 2013/0257827 A1* | 10/2013 | Hsieh et al. | 345/204 |
| 2013/0293594 A1* | 11/2013 | Kang | 345/690 |

* cited by examiner

START CONTROL CIRCUIT, DISPLAY PANEL DRIVING CIRCUIT AND DISPLAY DEVICE

TECHNICAL FIELD

The present invention relates to the field of LED television, and more particularly, relates to a start control circuit, a display panel driving circuit and a display device having the same.

BACKGROUND

For existing LED televisions, soft start times of starting moments in different starting modes are the same. When the starting mode is a three-dimension starting mode, a maximum current flowing through the LED is much more than the maximum current flowing through the LED in a two-dimension starting mode. If the soft start times of the starting moments in different starting modes are the same, then it will cause that when the starting mode is the three-dimension starting mode, at the starting moment, the current flowing through the inductor is excessive thus it exceeds the saturation current of the inductor or it exceeds the rated current specification of the field-effect tube.

BRIEF SUMMARY

To overcome the drawbacks that in the prior art, the current flowing through the inductor is excessive, exceeding the saturation current of the inductor or exceeding the rated current specification of the field-effect tube at the starting moment; the objective of the present invention is to provide a start control circuit, a display panel driving circuit and a display device, which can effectively protect the circuit and prevent the excessive current at the starting moment.

In order to achieve the above-mentioned objective, the technical solutions of the present invention are as follows:

a start control circuit is provided, which comprises a first switch unit, a start control unit and a second switch unit; an output port of the first switch unit is connected to an input port of the start control unit, an output port of the start control unit is connected to an input port of the second switch unit; the first switch unit is configured to determine a charging path of the start control unit according to the input signals of different start modes; the start control unit is configured to carry out the corresponding start modes, and store start energy of the corresponding start modes during a period of charging time corresponding to the charging path, thereby control the current of the second switch unit at the starting moment; the period of charging time is soft start time; and the second switch unit is configured to control an external circuit by receiving gating signals outputted from the start control unit.

In the start control circuit according to the present invention, the start modes include a two-dimension start mode and a three-dimension start mode, the charging path includes a first charging path and a second charging path.

In the start control circuit according to the present invention, the first switch unit includes a second field-effect tube, the source of the second field-effect tube is grounded, the gate of the second field-effect tube receives input signals of the two-dimension start mode or the three-dimension start mode, and control the second field-effect tube turning off or on according to the input signals of the two-dimension start mode or the three-dimension start mode detected.

In the start control circuit according to the present invention, the start control unit includes an integrated chip, a first capacitor and a second capacitor, one ends of the first capacitor and the second capacitor are together connected to a soft start port of the integrated chip, the other end of the first capacitor is connected to the source of the second field-effect tube, the other end of the second capacitor is connected to the drain of the second field-effect tube;

in the two-dimension start mode, the input signals are low level, and the second field-effect tube is turning off, the charging of the second capacitor is cut off, in this case, the first charging path is the charging path charging the first capacitor, and the start energy of the two-dimension start mode is stored during the soft start time corresponding to the first capacitor;

in the three-dimension start mode, the input signals are high level, and the second field-effect tube is turning on, in this case, the second charging path is the charging path charging the first capacitor and the second capacitor, and the start energy of the three-dimension start mode is stored during the soft start time corresponding to the first capacitor and the second capacitor.

In the start control circuit according to the present invention, the start energy of the three-dimension start mode is more than the start energy of the two-dimension start mode.

In the start control circuit according to the present invention, the second switch unit includes an inductor, a first field-effect tube; one end of the inductor is connected to the drain of the first field-effect tube; the second switch unit further includes a first resistor, the first resistor is connected to a gating port of the integrated chip and the gate of the first field-effect tube; a third resistor, the third resistor is connected to a current detection port of the integrated chip and the source of the first field-effect tube; and a second resistor, one end of the second resistor is connected to the source of the first field-effect tube, the other end of the second resistor is grounded.

A display panel driving circuit is also provided in the present invention, which includes a panel driving circuit and a light source driving circuit, the light source driving circuit includes a start control circuit;

the start control circuit comprises a first switch unit, a start control unit and a second switch unit; an output port of the first switch unit is connected to an input port of the start control unit, an output port of the start control unit is connected to an input port of the second switch unit;

the first switch unit is configured to determine a charging path of the start control unit according to the input signals of different start modes;

the start control unit is configured to carry out the corresponding start modes, and store start energy of the corresponding start modes during a period of charging time corresponding to the charging path, thereby control the current of the second switch unit at the starting moment; the period of charging time is soft start time;

the second switch unit is configured to control an external circuit by receiving gating signals outputted from the start control unit.

In the display panel driving circuit according to the present invention, the start modes include a two-dimension start mode and a three-dimension start mode, the charging path includes a first charging path and a second charging path.

In the display panel driving circuit according to the present invention, the first switch unit includes a second field-effect tube, the source of the second field-effect tube is grounded, the gate of the second field-effect tube receives input signals of the two-dimension start mode or the three-dimension start mode, and controls the second field-effect tube turning off or on according to the input signals of the two-dimension start mode or the three-dimension start mode detected.

In the display panel driving circuit according to the present invention, the start control unit includes an integrated chip, a first capacitor and a second capacitor, one ends of the first capacitor and the second capacitor are together connected to a soft start port of the integrated chip, the other end of the first capacitor is connected to the source of the second field-effect tube, the other end of the second capacitor is connected to the drain of the second field-effect tube;

in the two-dimension start mode, the input signals are low level, and the second field-effect tube is turning off, in this case, the first charging path is the charging path charging the first capacitor, and stores the start energy of the two-dimension start mode within the soft start time corresponding to the first capacitor;

in the three-dimension start mode, the input signals are high level, and the second field-effect tube is turning on, in this case, the second charging path is the charging path charging the first capacitor and the second capacitor, and stores the start energy of the three-dimension start mode within the soft start time corresponding to the first capacitor and the second capacitor.

In the display panel driving circuit according to the present invention, the start energy of the three-dimension start mode is more than the start energy of the two-dimension start mode.

In the display panel driving circuit according to the present invention, the second switch unit includes an inductor, a first field-effect tube; one end of the inductor is connected to the drain of the first field-effect tube; the second switch unit further includes a first resistor, the first resistor is connected to a gating port of the integrated chip and the gate of the first field-effect tube; a third resistor, the third resistor is connected to a current detection port of the integrated chip and the source of the first field-effect tube; and a second resistor, one end of the second resistor is connected to the source of the first field-effect tube, the other end of the second resistor is grounded.

A display device is also provided in the present invention, which includes a panel driving circuit and a light source driving circuit, wherein, the light source driving circuit includes a start control circuit;

the start control circuit comprises a first switch unit, a start control unit and a second switch unit; an output port of the first switch unit is connected to an input port of the start control unit, an output port of the start control unit is connected to an input port of the second switch unit;

the first switch unit is configured to determine a charging path of the start control unit according to the input signals of different start modes;

the start control unit is configured to carry out the corresponding start modes, and store start energy of the corresponding start modes during a period of charging time corresponding to the charging path, thereby control the current of the second switch unit at the starting moment; the period of charging time is soft start time;

the second switch unit is configured to control an external circuit by receiving gating signals outputted from the start control unit.

In the display panel driving circuit according to the present invention, the start modes include a two-dimension start mode and a three-dimension start mode, the charging path includes a first charging path and a second charging path.

In the display panel driving circuit according to the present invention, switch unit includes a second field-effect tube, the source of the second field-effect tube is grounded, the gate of the second field-effect tube receives input signals from the two-dimension start mode or the three-dimension start mode, and controls the second field-effect tube turning off or on according to the input signals of the two-dimension start mode or the three-dimension start mode detected.

In the display panel driving circuit device according to the present invention, the start control unit includes an integrated chip, a first capacitor and a second capacitor, one ends of the first capacitor and the second capacitor are together connected to a soft start port of the integrated chip, the other end of the first capacitor is connected to the source of the second field-effect tube, the other end of the second capacitor is connected to the drain of the second field-effect tube;

in the two-dimension start mode, the input signals are low level, and the second field-effect tube is turning off, in this case, the first charging path is the charging path charging the first capacitor, and stores the start energy of the two-dimension start mode within the soft start time corresponding to the first capacitor;

in the three-dimension start mode, the input signals are high level, and the second field-effect tube is turning on, in this case, the second charging path is charging the first capacitor and the second capacitor, and stores the start energy of the three-dimension start mode within the soft start time corresponding to the first capacitor and the second capacitor.

In the display panel driving circuit according to the present invention, the start energy of the three-dimension start mode is more than the start energy of the two-dimension start mode.

In the display panel driving circuit according to the present invention, the second switch unit includes an inductor, a first field-effect tube; one end of the inductor is connected to the drain of the first field-effect tube; the second switch unit further includes a first resistor, the first resistor is connected to a gating port of the integrated chip and the gate of the first field-effect tube; a third resistor, the third resistor is connected to a current detection port of the integrated chip and the source of the first field-effect tube; and a second resistor, one end of the second resistor is connected to the source of the first field-effect tube, the other end of the second resistor is grounded.

Compared with the prior art, the advantageous effects of the present invention is that, in the different start modes, the inductor and field-effect tube are protected at the starting moment. One can determine the charging path of the start control unit according to input signals of different start modes, carry out the corresponding start modes, and store the corresponding start energy of the start modes within the period of charging time corresponding to the charging path, thereby preventing the excessive current at the starting moment. Particularly when the start mode is three-dimension start mode, since the charging capacitance increases, the soft start time is extended, and the setting up time for output is longer, thus can achieve the effect of gradually accumulating more energy, and thereby, the excessive current flowing through the inductor and the field-effect tube at the starting moment which is the three dimension start mode is prevented. The configuration of circuit in the present invention is simple, and the cost is low.

DETAILED DESCRIPTION OF THE PREFERRED EMBODIMENT

In order to solve the problem that in the prior art, the current flowing through the inductor is excessive, exceeding the saturation current of the inductor or exceeding the rated current specification of the field-effect tube at the starting moment, the present invention extends the soft start time, and a second capacitor is connected in parallel with a first capacitor in the existing circuit. Utilizing a principle of the high and low level of the circuit, different charging paths are determined. Within a period of charging time corresponding to the charging path (i.e. soft start time), start energy of the corresponding start mode is stored, thereby the current at the starting moment is controlled. Since in the present invention, a charging path is added, and different soft start time carried out in different start modes can be achieved by changing the value of a corresponding charging capacitor C, so as to get rid of the problem that the current is excessive at the starting moment, and the objective of protecting the circuit is achieved.

Figure 1:
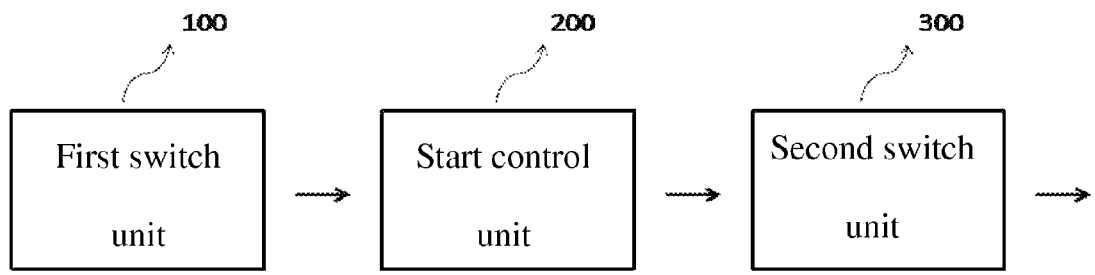
FIG. 1 is a circuit block diagram of a start control circuit.

Referring to FIG. 1, is a circuit block diagram of a start control circuit, wherein, the start control circuit comprises a first switch unit 100, a start control unit 200, and a second switch unit 300. An output port of the first switch unit 100 is connected to an input port of the start control unit 200, and an output port of the start control unit 200 is connected to an input port of the second switch unit 300. The first switch unit 100 is configured to determine a charging path of the start control unit 200 according to input signals of different start modes. The start control unit 200 is configured to carry out the corresponding start modes, and store start energy of the corresponding start modes within a period of charging time corresponding to the charging path, and thus the current of the second switch unit 300 at the starting moment is controlled. The period of charging time is soft start time. The second switch unit 300 is configured to control an external circuit by receiving gating signals outputted from the start control unit 200.

Figure 2:
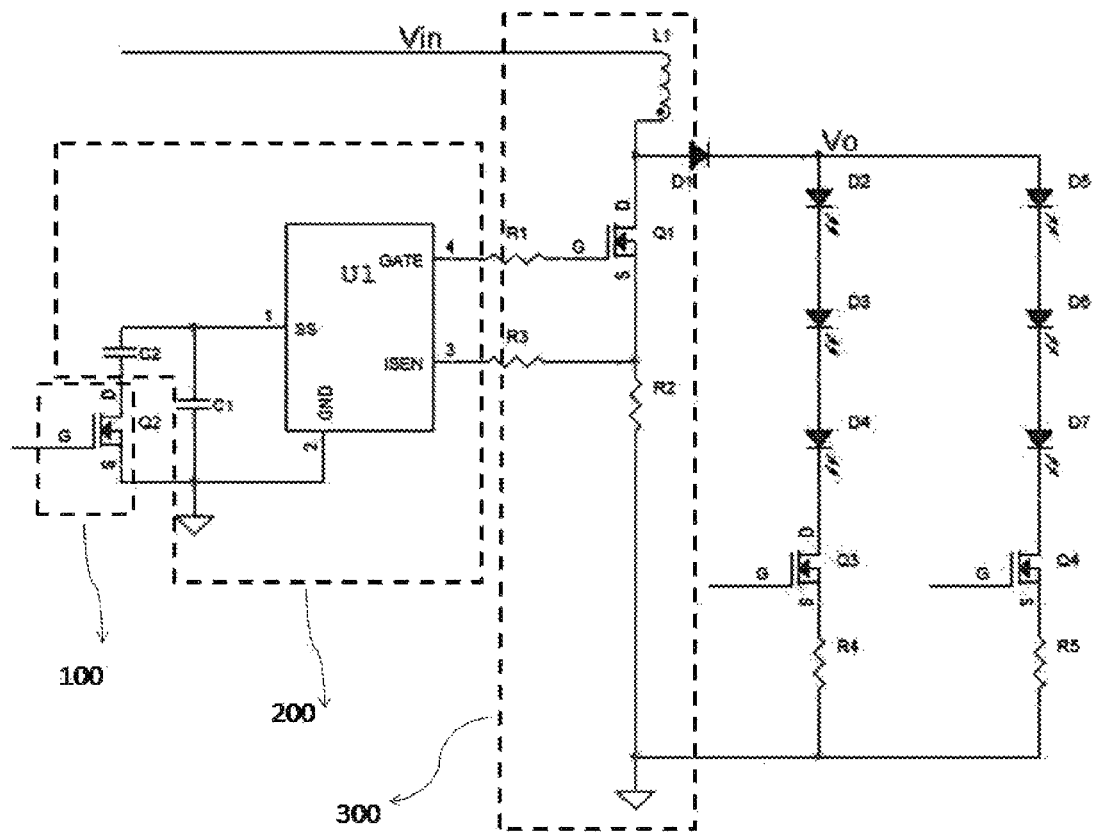
FIG. 2 is a circuit schematic view of a start control circuit according to a preferred embodiment of the present invention.

Referring to FIG. 2, is a circuit schematic view of a start control circuit according to a preferred embodiment of the present invention. A second field-effect tube Q2 detects input signals of the different start modes by the gate, and the drain of the second field-effect tube Q2 is connected to a second capacitor C2, the source of the second field-effect tube Q2 is connected to a common ground signal port 2 of an integrated chip U1, the other end of the second capacitor C2 is connected to a soft start port 1 of the integrated chip U1, and two ends of a first capacitor C1 is directly connected to the soft start port 1 and the common ground port 2 of the integrated chip U1. A gating port 4 of the integrated chip U1 is connected to the gate of a first field-effect tube Q1 through a first resistor R1, a current detection port 3 of the integrated chip U1 is connected to the source of the first field-effect tube Q1 through a third resistor R3, the source of the first field-effect tube Q1 is connected to the common ground signal through a second resistor R2, and the drain of the first field-effect tube Q1 is connected to a power source Vin through an inductor L1. The integrated chip U1 is a common control chip, and the type is indefinite, it belongs to the well-known technology in the art, and is not described in details here.

The start modes of the start control circuit of the present invention includes a two-dimension start mode and a three-dimension start mode, that is, the 2D mode and 3d mode of the LED. The start energy of the three-dimension start mode is more than the start energy of the two-dimension start mode. The charging path includes a first charging path and a second charging path. The first charging path charges the first capacitor C1, and the second charging path charges the first capacitor C1 and the second capacitor C2 simultaneously. In the integrated chip U1, it will generate a constant current Iss at the soft start port 1 to charge the capacitor connected to the soft start port 1. When the voltage of the soft start port 1 is more than a constant voltage Vss within the inside of the integrated chip U1, the soft start ends. The soft start time is the period of charging time of the capacitor in the charging path, and the charging formula of the capacitor is t=c*u/I.

During the two-dimension start mode, the input signal is a low level. When the gate of the second field-effect tube Q2 detects that the input signal is a low level, the second field-effect tube Q2 is turned off, and the charging of the second capacitor C2 is disconnected. In this case, the turning off of the second field-effect tube of the first switch unit 100 determines that the capacitor charging path in the start control unit 200 is the first charging path, and the soft start time is the period of charging time of the first capacitor C1. That is, when it is the two-dimension start mode, the soft start time is (C1*Vss)/Iss.

However, during the three-dimension start mode, the input signal is a high level. In this case, the second field-effect tube Q2 is turned on, and it determines that the capacitor charging path in the start control unit 200 is the second charging path, and the second charging path charges the first capacitor C1 and the second capacitor C2. The charging capacitor is equal to the first capacitor and the second capacitor connected in parallel. That is, the capacitance is equivalent to the two capacitances added together (C1+C2), and it means that when it is the three-dimension start mode, the soft start time is (C1+C2)*Vss/Iss.

It is obvious that the soft start time is longer in the three-dimension start mode. In the two-dimension start mode and the three-dimension start mode of the prior art, the charging capacitors at the starting moment are the same, both are C1, thus the soft start time is also the same, the soft start time is (C1*Vss)/Iss. However, in the three-dimension start mode, the maximum current flowing through the LED is much more than that the maximum current flowing through the LED in the two-dimension start mode, and therefore, the output voltage Vo in the three-dimension start mode is more than the output voltage in the two-dimension start mode. It causes that when the start mode is the three-dimension start mode, it will need more energy provided at the starting moment, and the current flowing through the inductor L1 and the first field-effect tube Q1 in the second switch unit 300 is excessive. Therefore, the present invention improves the soft starting path, and achieves that different soft starting paths are carried out in different start mode. Compared with the prior art, the present invention extends the soft start time, the setting up time of output is longer, thus can achieve the effect of gradually accumulating more energy, and thereby, the excessive current flowing through the inductor and the field-effect tube at the starting moment is prevented.

In a start control circuit of the present invention, after the soft start ended, the integrated chip U1 in the start control unit 200 may output gating signals from the gating port 4 to the gate of the first field-effect tube Q1 in the second switch unit 300, and achieve the control of turning on and off of the subsequent connecting circuit. At the same time, the current detection port 3 of the integrated chip U1 controls the power of the switching power supply in the subsequent connecting circuit. Referring to FIG. 1, the second switching unit 300 is external connected to a LED string lights display unit, the gating port 4 of the integrated chip U1 controls turning on and off of the LED string lights display unit, the current detection port 3 of the integrated chip U1 controls the power of the switching power supply of the LED string lights display unit. It belongs to the well-known technology in the art, and is not described in details here.

The present invention also discloses a display panel driving circuit and a display device. Both of the display panel driving circuit and the display device includes panel driving circuits and light source driving circuits, and the light source driving circuits includes the start control circuit in the above-mentioned embodiments. The panel driving circuit and the light source driving circuit belong to the well-known technology in the art, and are not described in details here.

It should be understood that, those skilled in the art can make many modifications or transformations according to the above-mentioned specification. And all these modifications and transformations belong to the protection of the claims in the present invention.

The invention claimed is:

1. A start control circuit, comprising a first switch unit, a start control unit and a second switch unit; an output port of the first switch unit is connected to an input port of the start control unit, an output port of the start control unit is connected to an input port of the second switch unit;
the first switch unit is configured to determine a charging path of the start control unit according to input signals of different start modes;
the start control unit is configured to carry out the corresponding start modes, and store start energy of the corresponding start modes during a period of charging time corresponding to the charging path, thereby control a current of the second switch unit at a starting moment; the period of charging time is soft start time;
the second switch unit is configured to control an external circuit by receiving gating signals outputted from the start control unit;
the start modes include a two-dimension start mode and a three-dimension start mode, the charging path includes a first charging path and a second charging path.

2. The start control circuit according to claim 1, wherein the first switch unit includes a first field-effect tube, a source of the first field-effect tube is grounded, a gate of the first field-effect tube receives input signals of the two-dimension start mode or the three-dimension start mode, and control the first field-effect tube turning off or on according to the input signals of the two-dimension start mode or the three-dimension start mode detected.

3. The start control circuit according to claim 2, wherein the start control unit includes an integrated chip, a first capacitor and a second capacitor, one ends of the first capacitor and the second capacitor are together connected to a soft start port of the integrated chip, the other end of the first capacitor is connected to the source of the second field-effect tube, the other end of the second capacitor is connected to a drain of the first field-effect tube;
in the two-dimension start mode, the input signals are low level, and the first field-effect tube is turning off, in this case, the first charging path is the charging path charging the first capacitor, and stores the start energy of the two-dimension start mode within the soft start time corresponding to the first capacitor;
in the three-dimension start mode, the input signals are high level, and the second first field-effect tube is turning on, in this case, the second charging path is the charging path charging the first capacitor and the second capacitor, and the start energy of the three-dimension start mode is stored during the soft start time corresponding to the first capacitor and the second capacitor.

4. The start control circuit according to claim 3, wherein the start energy of the three-dimension start mode is more than the start energy of the two-dimension start mode.

5. The start control circuit according to claim 4, wherein the second switch unit includes an inductor, a second field-effect tube, one end of the inductor is connected to a drain of the second field-effect tube; the second switch unit further includes a first resistor, the first resistor is connected to a gating port of the integrated chip and a gate of the second field-effect tube; a third resistor, the third resistor is connected to a current detection port of the integrated chip and a source of the second field-effect tube; a second resistor, one end of the second resistor is connected to the source of the second field-effect tube, the other end of the second resistor is grounded.

6. A display panel driving circuit, including a panel driving circuit and a light source driving circuit, wherein the light source driving circuit includes a start control circuit;
the start control circuit comprises a first switch unit, a start control unit and a second switch unit; an output port of the first switch unit is connected to an input port of the start control unit, an output port of the start control unit is connected to an input port of the second switch unit;
the first switch unit is configured to determine a charging path of the start control unit according to input signals of different start modes;
the start control unit is configured to carry out the corresponding start modes, and store start energy of the corresponding start modes during a period of charging time corresponding to the charging path, thereby control a current of the second switch unit at a starting moment; the period of charging time is soft start time;
the second switch unit is configured to control an external circuit by receiving gating signals outputted from the start control unit;
the start modes include a two-dimension start mode and a three-dimension start mode, the charging path includes a first charging path and a second charging path.

7. The display panel driving circuit according to claim 6, wherein the first switch unit includes a first field-effect tube, a source of the first field-effect tube is grounded, a gate of the first field-effect tube receives input signals of the two-dimension start mode or the three-dimension start mode, and controls the first field-effect tube turning off or on according to the input signals of the two-dimension start mode or the three-dimension start mode detected.

8. The display panel driving circuit according to claim 7, wherein the start control unit includes an integrated chip, a first capacitor and a second capacitor, one ends of the first capacitor and the second capacitor are together connected to a soft start port of the integrated chip, the other end of the first capacitor is connected to the source of the first field-effect tube, the other end of the second capacitor is connected to a drain of the first field-effect tube;
in the two-dimension start mode, the input signals are low level, and the first field-effect tube is turning off, in this case, the first charging path is the charging path charging the first capacitor, and stores the start energy of the two-dimension start mode within the soft start time corresponding to the first capacitor;
in the three-dimension start mode, the input signals are high level, and the first field-effect tube is turning on, in this case, the second charging path is the charging path charging the first capacitor and the second capacitor, and stores the start energy of the three-dimension start mode during the soft start time corresponding to the first capacitor and the second capacitor.

9. The display panel driving circuit according to claim 8, wherein the start energy of the three-dimension start mode is more than the start energy of the two-dimension start mode.

10. The display panel driving circuit according to claim 9, wherein the second switch unit includes an inductor, a second field-effect tube; one end of the inductor is connected to a drain of the second field-effect tube; the second switch unit further includes a first resistor, the first resistor is connected to a gating port of the integrated chip and a gate of the second field-effect tube; a third resistor, the third resistor is connected to a current detection port of the integrated chip and a source of the second field-effect tube; a second resistor, one end of the second resistor is connected to the source of the second field-effect tube, the other end of the second resistor is grounded.

11. A display device, including a panel driving circuit and a light source driving circuit, wherein the light source driving circuit includes a start control circuit;

the start control circuit comprises a first switch unit, a start control unit and a second switch unit; an output port of the first switch unit is connected to an input port of the start control unit, an output port of the start control unit is connected to an input port of the second switch unit;

the first switch unit is configured to determine a charging path of the start control unit according to input signals of different start modes;

the start control unit is configured to carry out the corresponding start modes, and store start energy of the corresponding start modes within a period of charging time corresponding to the charging path, thereby control a current of the second switch unit at a starting moment; the period of charging time is soft start time;

the second switch unit is configured to control an external circuit by receiving gating signals outputted from the start control unit;

the start modes include a two-dimension start mode and a three-dimension start mode, the charging path includes a first charging path and a second charging path.

12. The display device according to claim 11, wherein the first switch unit includes a first field-effect tube, a source of the first field-effect tube is grounded, a gate of the first field-effect tube receives input signals of the two-dimension start mode or the three-dimension start mode, and controls the first field-effect tube turning off or on according to the input signals of the two-dimension start mode or the three-dimension start mode detected.

13. The display device according to claim 12, wherein the start control unit includes an integrated chip, a first capacitor and a second capacitor, one ends of the first capacitor and the second capacitor are together connected to a soft start port of the integrated chip, the other end of the first capacitor is connected to the source of the first field-effect tube, the other end of the second capacitor is connected to a drain of the first field-effect tube;

in the two-dimension start mode, the input signals are low level, and the first field-effect tube is turning off, in this case, the first charging path is the charging path charging the first capacitor, and stores the start energy of the two-dimension start mode within the soft start time corresponding to the first capacitor;

in the three-dimension start mode, the input signals are high level, and the first field-effect tube is turning on, in this case, the second charging path is the charging path charging the first capacitor and the second capacitor, and stores the start energy of the three-dimension start mode within the soft start time corresponding to the first capacitor and the second capacitor.

14. The display device according to claim 13, wherein the start energy of the three-dimension start mode is more than the start energy of the two-dimension start mode.

15. The display device according to claim 14, wherein the second switch unit includes an inductor, a second field-effect tube; one end of the inductor is connected to a drain of the second field-effect tube; the second switch unit further includes a first resistor, the first resistor is connected to a gating port of the integrated chip and a gate of the second field-effect tube; a third resistor, the third resistor is connected to a current detection port of the integrated chip and a source of the second field-effect tube; a second resistor, one end of the second resistor is connected to the source of the second field-effect tube, the other end of the second resistor is grounded.

* * * * *